(12) United States Patent
Tanishima

(10) Patent No.: US 7,048,247 B2
(45) Date of Patent: May 23, 2006

(54) SUPPORT LEG DEVICE FOR EQUIPMENT CASE

(75) Inventor: Takao Tanishima, Tokyo (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 10/385,196

(22) Filed: Mar. 10, 2003

(65) Prior Publication Data

US 2003/0218957 A1 Nov. 27, 2003

(30) Foreign Application Priority Data

Mar. 11, 2002 (JP) ............................ 2002-065188
Jun. 12, 2002 (JP) ............................ 2002-171610

(51) Int. Cl.
*F16F 15/00* (2006.01)

(52) U.S. Cl. ................. 248/638; 248/188.8; 248/188.9

(58) Field of Classification Search ................ 248/638, 248/677, 562, 632, 633, 634, 188.8, 188.9
See application file for complete search history.

(56) References Cited

U.S. PATENT DOCUMENTS

| | | | | |
|---|---|---|---|---|
| 997,842 A | * | 7/1911 | Metzroth | ...................... 248/615 |
| 1,158,039 A | * | 10/1915 | Florey | ............................ 4/248 |
| 1,792,872 A | * | 2/1931 | Saurer | ........................ 248/634 |
| 2,739,774 A | * | 3/1956 | Crede | ......................... 248/616 |
| 2,796,920 A | * | 6/1957 | Cowles | ........................ 297/291 |
| 3,815,852 A | * | 6/1974 | May | ............................. 248/569 |
| 4,199,128 A | * | 4/1980 | van den Boom et al. | ..................... 267/140.13 |
| 5,560,592 A | * | 10/1996 | Shimoda et al. | ....... 267/140.13 |
| 5,681,023 A | * | 10/1997 | Sheydayi | .................... 248/638 |
| 5,771,990 A | * | 6/1998 | Liang | ......................... 181/208 |
| 5,975,972 A | * | 11/1999 | Wilmsen | .................... 440/111 |
| 6,155,530 A | * | 12/2000 | Borgen | ....................... 248/638 |
| 6,357,717 B1 | * | 3/2002 | Kennard, IV | ............... 248/638 |
| 6,572,071 B1 | * | 6/2003 | Tsai | ............................. 248/618 |
| 6,669,153 B1 | * | 12/2003 | Allan | ...................... 248/188.9 |

FOREIGN PATENT DOCUMENTS

JP 5-143080 6/1993

* cited by examiner

*Primary Examiner*—Ramon O. Ramirez
*Assistant Examiner*—Steven Marsh
(74) *Attorney, Agent, or Firm*—Weingarten, Schurgin, Gagnebin & Lebovici LLP

(57) ABSTRACT

A support leg for an equipment case is made of a support leg main body and a stand base. The main body defines a concave (recessed) portion in the bottom thereof. A spire head portion that defines a spike is disposed in the concave portion so the spike does not extend beyond the bottom of the main body. Optionally, cushioning material is attached to the bottom of the main body to protect a surface on which the support leg breasts, while the support leg is used without the stand base. Optionally, the stand base is loosely attached to the support leg, such as by one or more screws.

24 Claims, 9 Drawing Sheets

(A)

(B)

SUPPORT LEG DEVICE FOR EQUIPMENT CASE

BACKGROUND OF THE INVENTION

1. Field of the Invention

This invention relates to a support leg device preferred to be used for cases of an audio equipment such as an audio system or the like, or various information equipment.

2. Detailed Description of the Prior Art

Conventionally, for example, a disk player, which reproduces sound by driving an optical disk abbreviated to CD (compact disk) or DVD (digital versatile disk), is provided with a power source for rotationally driving the disk, therefore, the inside of the equipment is excited to oscillate and resonance occurs. Moreover, since such an audio equipment is generally set up on a rack like an audio rack or the like, the rack is excited by external causes in the room or the reproduced sound, and the vibration is transmitted to the equipment internals.

However, an optical disk is provided with a minute continuous track formed thereon, and the track is read by being irradiated with laser light from a servo-controlled optical pickup. Therefore, this optical pickup is arranged so as to drive the disk by accurately following up even a minute servo signal, and for this purpose, the optical pickup has a supported construction so as to be easy to move in the directions of tracking and focusing.

Due to such a structural feature, even a slight shake of the optical pickup caused by vibration transmitted from a driving source of the optical disk or the outside of the equipment causes a pit reading error of the optical pickup, namely, it causes a pit loss to deteriorate an audio reproduction characteristic.

Therefore, as a means, what is called a means for mechanical earthing, for absorbing and cutting off the vibrations, a combination of elastic bodies such as a coil spring or rubber as support legs of the equipment case is generally adopted, however in the case of such a combined construction, the support legs are secured to the bottom plate of the equipment case by screws. Therefore, the fitting strength of the support legs is limited by the rigidity of the screw, and the mechanical earthing has not sufficiently been obtainable. As a means for solving such a problem, it has been confirmed that the case is effectively supported at three or four points by using spike legs in contact with the rack at a single point, respectively.

This arrangement is such one that for example, as shown in FIG. 5, a leg pillar L1 of a support leg main body L secured to an audio equipment A such as a disk player is formed like a conic spike shape so that its spiry point is grounded on the top plate surface of the rack B, and normally, a stand base S is to be interposed between the leg pillar L1 and the rack after setting up of the audio equipment. Moreover, in order to absorb and cut off the vibrations more effectively, there is a tendency to increase the sharpness of the leg pillar L2 as shown in FIG. 6.

SUMMARY OF THE INVENTION

However, in the case of this kind of an audio equipment for which the improvement in an audio reproduction characteristic is sought after, the equipment has to be structured so as to eliminate vibration and resonance as an increase in weight accompanied by reinforcement of the power supply portion, therefore, the driving system and the case are increased in mass, and a high-grade model has a very large weight as much as around 25 kg, and the installation of the audio equipment provided with the spike legs is not easy but requires carefulness.

Namely, as to set-up procedures of such an audio equipment, the equipment main body is firstly mounted on a temporary set-up position. Since the spike body obviously scratches the top plate surface of the rack then, a protective sheet is placed by predicting spike lag positions, and the spike legs are earthed on the protective sheet. Thereafter, the protective sheets are removed by slightly lifting the one side of the equipment main body, and the stand bases are installed under the spike bodies.

When the equipment is heavy, such a set-up work is hard and complex, and carefulness has been required. Moreover, when the spike body is made sharper as shown in FIG. 6, the fingers are in danger of being injured, and attention should be paid for safety.

However, the aforementioned work is relatively easy when it is performed in a space opened to the side and upper portions, but on the other hand, the set-up work is very difficult when the dead space has to be narrow in a closed space enclosed from right to left or up and down as shown in FIGS. 14 and 15. Especially, since the backside of the audio rack B is usually close to a wall in a room, there is no space permitting the set-up work, and so the workability has been extremely low together with the large weight of the audio equipment.

However, since it is essential to set up the audio equipment, the fact is that the audio equipment is usually set up in the audio rack B by a forcible work, and the spire head of the spike body may scratch largely the surface of the shelf board B1 and the surface of the stand base S. Moreover, when the equipment is heavy, the set-up has to be a complex work by large effort and the fingers are in danger of being injured by the spire heads of the spike bodies, and so attention should be paid for safety.

The present invention has been done considering such conventional problems, and the workability is improved by taking advantage of the conventional spike body at the time of setting up the equipment main body on the rack, and the spike body is also structured so as not to damage the rack and is further devised for the safety of the fingers at the time of the installation work. And, the support leg device is structured so as to be secured to the equipment case with high rigidity, to eliminate the vibration and resonance more efficiently, and further, it is realized even for a large weight equipment to be set up easily in an installation space with a poor dead space.

The present invention solves the abovementioned problems by means of; a first construction comprising a support leg main body in which a concave portion is formed in the bottom face center of a leg pillar made of a pure (i.e. void-free or solid) material such as a metal and a spire portion of a spike body faces in the space of the concave portion so as to be enclosed in it, and a stand base for bearing the shaft center of the spire head portion of the spike body;

a second construction in which a bolt formed into a spire potion at the end is screwed in the center of the leg pillar into the spike body in the above-mentioned first construction;

a third construction in which the spike body is formed into a single piece with the leg pillar in the above-mentioned first construction;

a fourth construction in which a cushioning material is pasted on the bottom face of the leg pillar in the above-mentioned first to third constructions; further, a fifth construction comprising a support leg main body provided with a leg pillar and a spike body having a spire portion formed smaller than the leg pillar in the dimension of the projecting height, and a stand base for bearing the shaft center of the spiry head of the spike body;

a sixth construction comprising a support leg main body having a spike body and a stand base for bearing the shaft center of the spiry head of the spike body, wherein the stand base is made up into one piece assembly with the support leg main body with a play state;

a seventh construction in which a peripheral wall surrounding the support leg main body is formed on the periphery of the stands base in the above-mentioned sixth construction;

an eighth construction comprising a fixing member which is fixed on the support leg main body and supports the stand base with a play state to the support leg main body in the above-mentioned sixth construction;

a ninth construction in which the fixing members are screws screw-held to the support leg main body in the above-mentioned eighth construction; and further, a tenth construction in which the stand base is provided with holes on the under surface thereof, and the fixing members are fixed to the support leg main body through the holes in the above-mentioned eighth construction.

BRIEF DESCRIPTION OF THE DRAWINGS

These and others and advantages of the present invention will become clear from following description with reference to the accompanying drawing, wherein.

EXPLANATION OF REFERENCE NUMERALS

Figure 1:
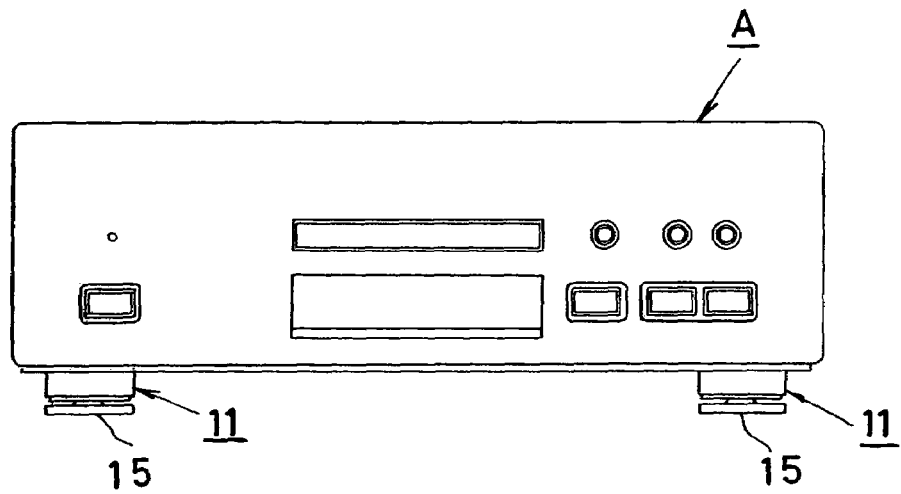
FIG. 1 is a front view showing an embodiment of the present invention.

11: Support leg main body
12: Leg pillar
12a: Concave portion
12b: Tapped hole
12c: Bottom face
12d: Spire head portion
12e: Screw portion (or threaded portion)
13: Cushioning material
14: Bolt
14a: Spire head portion
15: Stand base
15a: Bearing base portion
21: Support leg device
22: Support leg main body
23: Screw
24: Bolt
25: Stand base
25a: Bearing base portion
25e: Peripheral wall
26: Support leg main body
26a: Tapped hole
27: Bolt
28: Screw
29: Stand base
A: Audio equipment
B: Audio rack

DETAILED DESCRIPTION OF THE PREFERRED EMBODIMENT

While the presently preferred embodiment of the present invention has been shown and described, it will be understood that the present invention is not limited thereto, and that various changes and modification may be made by those skilled in the art without departing from the scope of the invention as set forth in the appended claims.

In the following, preferred embodiments of the present invention will be described referring to the drawings. Moreover, although the examples applied to a disk player for driving an optical disk will be explained as the preferred embodiments, the present invention can widely be embodied in an audio equipment such as an audio amplifier and a speaker system, or in other information equipment.

Embodiment 1

Figure 2:
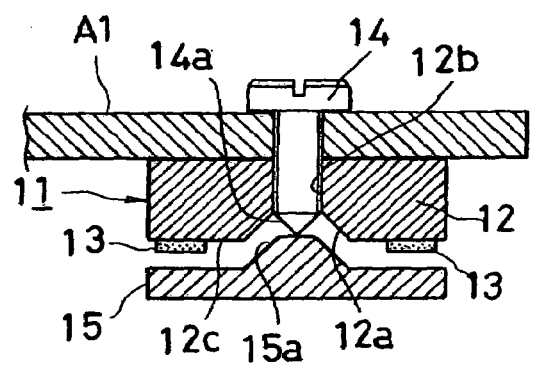
FIG. 2 is a sectional view of the first embodiment of the present invention.

FIG. 1 is a front view of an audio equipment A such as a disk player for which the present invention is embodied, and support leg devices are located so as to support a case bottom face at four points or three points which are two points in the front and one point behind. FIG. 2 is a sectional view showing the first embodiment of the support leg devices of the present invention, and in the figure, a support leg main body 11 is formed with a concave portion 12a in the center of the bottom face of a leg pillar 12 made of a pure material such as a metal, and a tapped hole 12b is formed at the center of the concave portion. Then, a cushioning material 13 such as felt is wholly or partially pasted around on a bottom face 12c of the leg pillar 12.

The leg pillar 12 thus constructed is screw-held by screwing a bolt 14 into the tapped hole 12b from the inside of the case, and is firmly secured together with a bottom plate A1 which is a part of the case of the audio equipment. The bolt 14 is provided with a conic spire head portion 14a formed at the tip so that the tip is a spike body, and the spire head portion is adjusted in length so as to face and to be enclosed in the space in the concave portion 12a of the leg pillar 12. Moreover, especially the spire head portion of the bolt 14 is preferably treated by hardening for high hardness.

Next, the reference numeral 15 is a stand base with a bearing base portion 15a formed in the center, and a shaft center of the spire head portion 14a of the bolt 14 is borne by the bearing base portion as shown in the figure.

Embodiment 2

Figure 3:
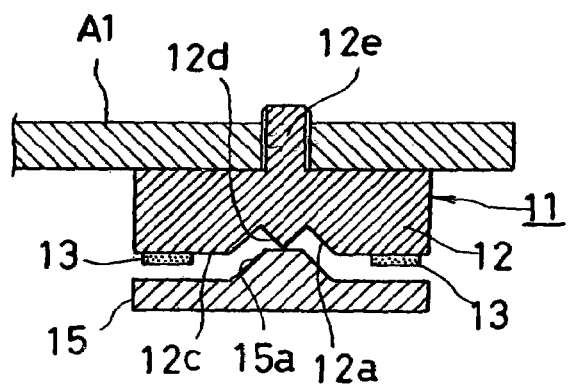
FIG. 3 is a sectional view of the second embodiment of the present invention.

FIG. 3 shows the second embodiment of the present invention, and the leg pillar 12 is provided with a spire head portion 12d and a screw portion 12e formed in one piece, and similarly to the first embodiment, the spire head portion 12d is formed so as to be enclosed in the space of a concave portion 12a. Then, a support leg main body 11 is secured by screwing the screw portion 12e into a tapped hole of a bottom plate A1 of the audio equipment A.

The procedures for mounting the audio equipment with the support leg devices thus constructed according to the present invention and setting them up on the rack such as an audio rack, will be described below.

Figure 4:
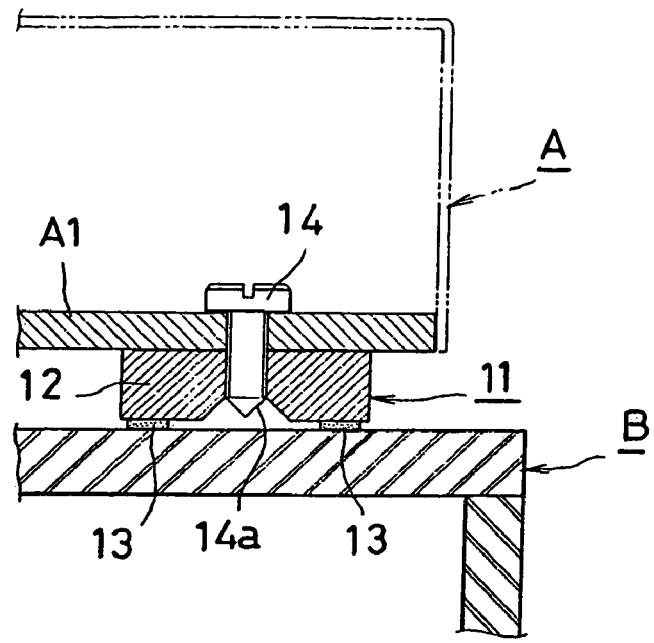
FIG. 4 is an explanatory drawing of the set-up procedures using the support leg devices according to the present invention.
Figure 4:
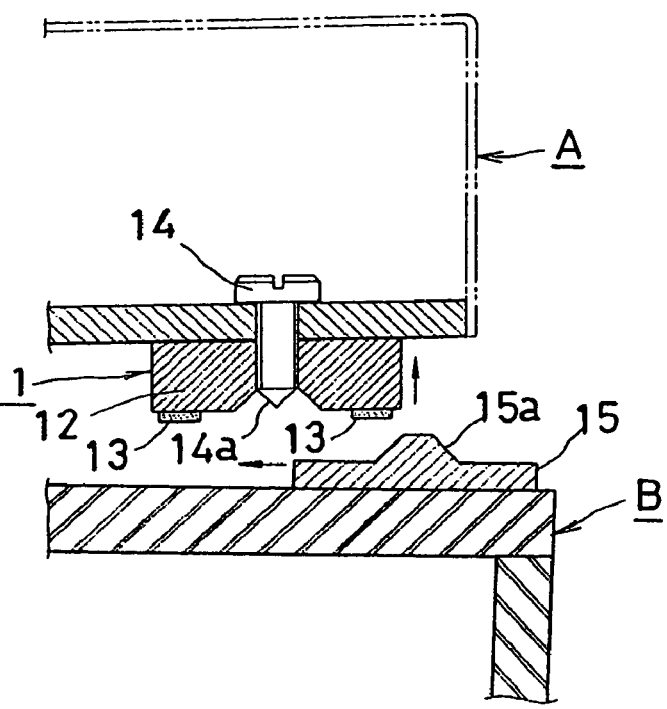
Figure 5:
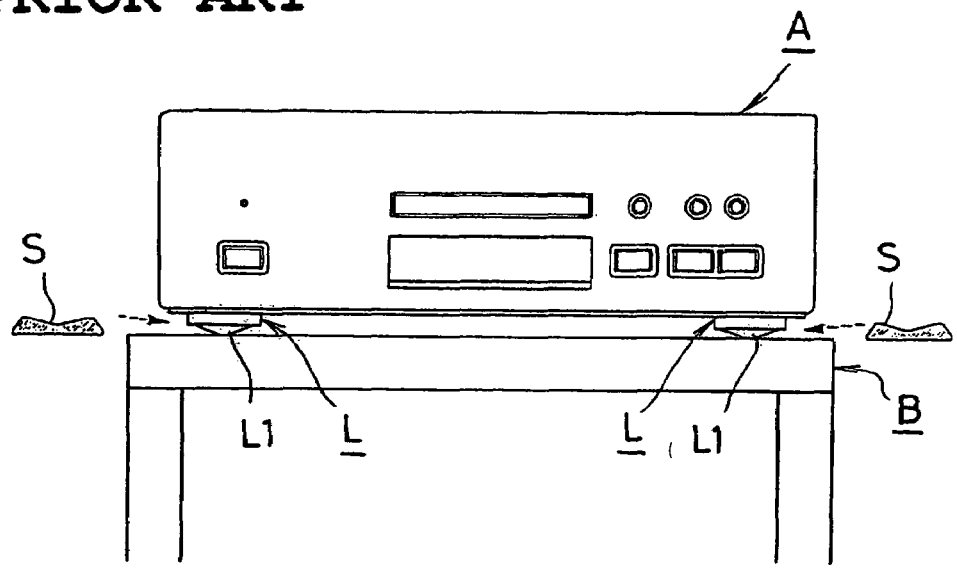
FIG. 5 is an explanatory drawing for showing a conventional support leg device.
Figure 6:
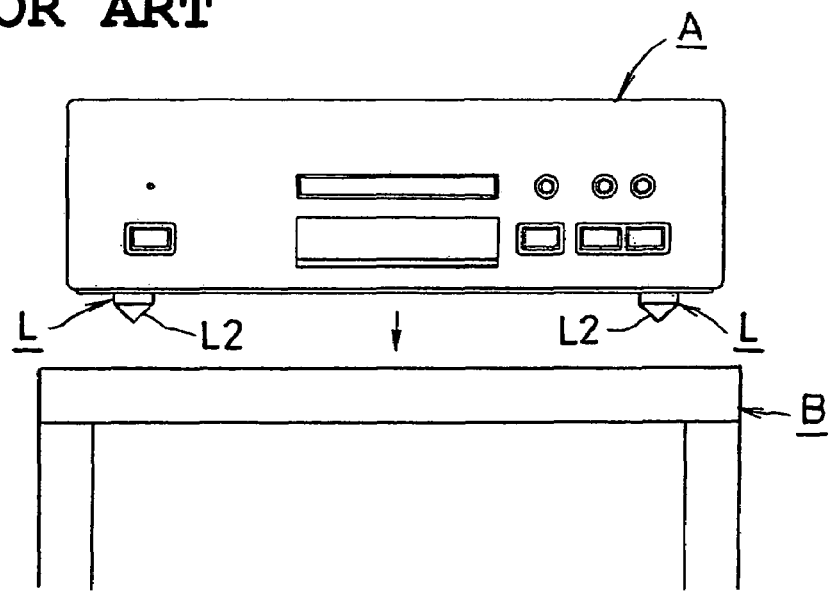
FIG. 6 is an explanatory drawing for showing another conventional support leg device.

As describe above, the support leg main body 11 is fixed to the bottom plate A1 of the audio equipment, therefore, when the equipment main body is mounted on a rack B, a cushioning material 13 pasted on the support leg main body 11 as shown in FIG. 4(A) comes into surface contact with the rack B. Then, by locating the equipment main body at a desired position, slightly pushing up the part where the support leg main body is positioned as shown in FIG. 4(B), placing a stand base 15 directly under the support leg main body 11, and thereafter putting the equipment main body back to the proper position, the stand base 15 is brought into one piece in the state of bearing the support leg main body 11 as shown in FIG. 2 and FIG. 3.

When the audio equipment has been set up as described above, the leg pillar serves as a cover to hide the spire head of the spike body thereunder, therefore, this spire head cannot be seen from the outside of the equipment in appearance, but this makes it possible to improve the design of the whole equipment. Moreover, in the present invention, the leg pillar of a pure material is structured so as to be directly fastened to the bottom plate of the case without using a separate part in-between, therefore, the bottom plate and the leg pillar can be made up in one piece, and vibration and resonance can be eliminated effectively together with the effect of the spike body.

Embodiment 3

Figure 7:
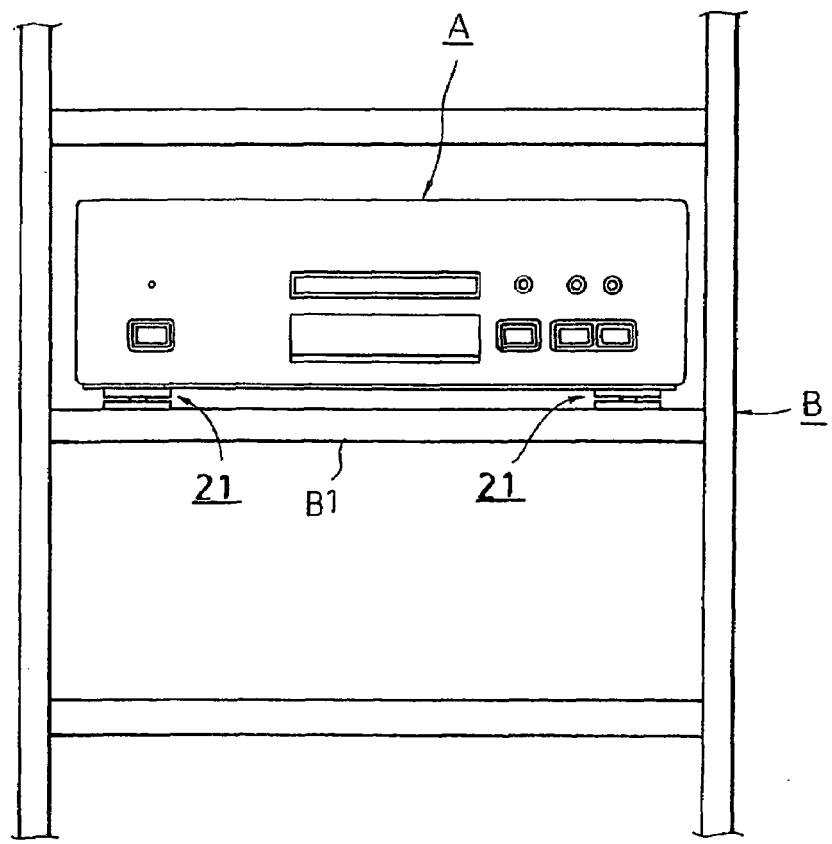
FIG. 7 is a front view of an audio equipment in which the support leg devices are embodied according to the present invention.

FIG. 7 is a front view showing the state in which the audio equipment A such as a disk player is set up on an audio rack B according to the present invention, and a support leg devices 21 are usually located so as to support the case bottom face at four points, i.e., at the four corners thereof, or at three points, i.e., two points in the front and one point behind.

Figure 8:
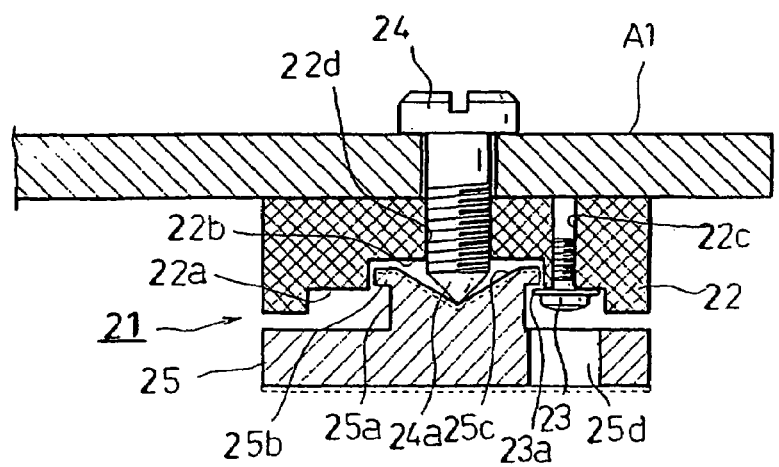
FIG. 8 is a sectional view of the third embodiment of the support leg device according to the present invention.
Figure 9:
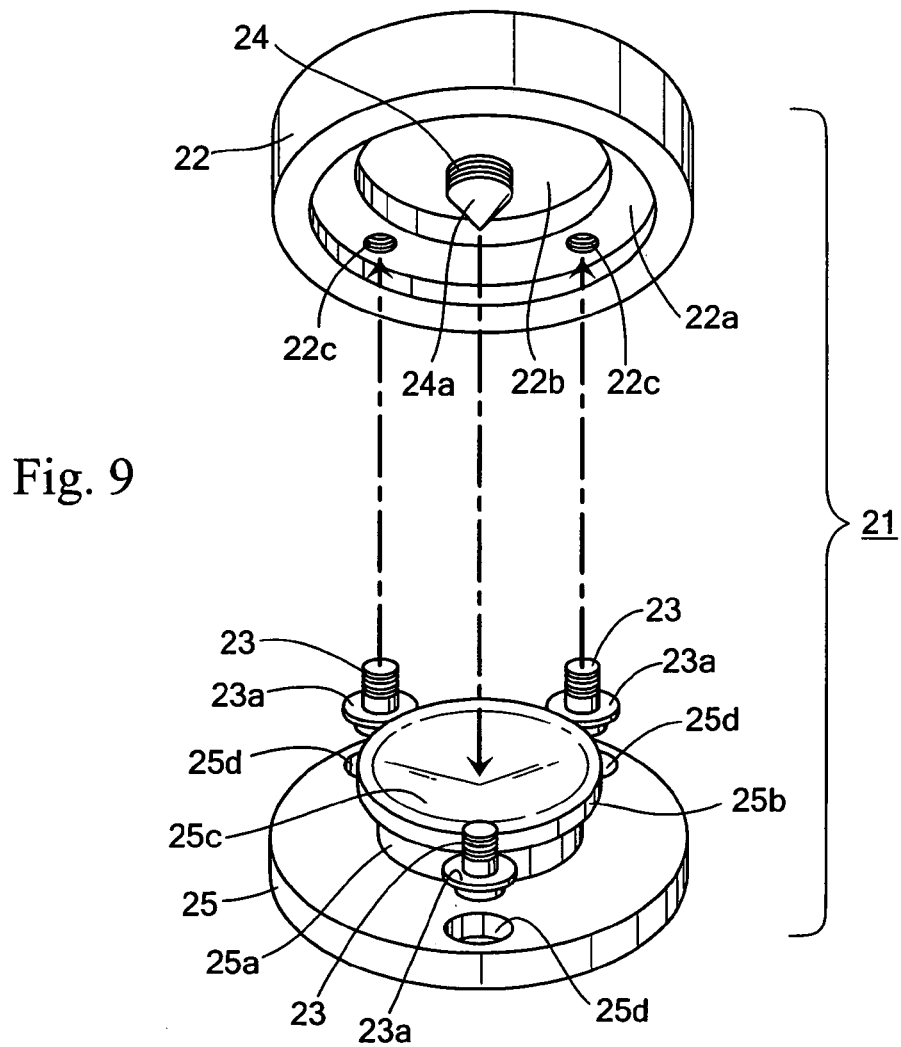
FIG. 9 is an exploded perspective view of the third embodiment of the support leg device according to the present invention.

FIGS. 8 and 9 are a sectional view and an exploded perspective view illustrating the third embodiment of the support leg device according to the present invention, and in the figures, a support leg main body 22 is made of a pure material such as a metal, and the bottom face is formed into an outer peripheral counter bore portion 22a and an inner peripheral counter bore portion 22b. Further, the outer peripheral counter bore portion 22a is provided with screw-holes 22c for screwing the screws 23 into there at equal angle positions, and the inner peripheral counter bore portion 22b is provided with a tapped hole 22d formed at the center.

The support leg main body 22 thus constructed is screw-held by screwing a bolt 24 into the tapped hole 22d from the inside of the equipment case, and is firmly secured together with a bottom plate A1 of the case.

The bolt 24 is formed into a conic spike body 24a formed with a spire head at the tip, and the spike body 24a is adjusted in length so as to face on the inside of the outer peripheral counter bore portion 22a and inner peripheral counter bore portion 22b. Moreover, especially the spike body 24a of the bolt 24 is preferably treated by hardening for higher hardness.

Next, the reference numeral 25 is a stand base, and is formed with a bearing base portion 25a at the center, further formed with a flange portion 25b on the upper portion and a tapered face 25c declining from the periphery toward the center. Further, through-holes 25d are formed at arbitrary positions on the periphery of the stand base 25 and on the circumference opposite to the screw-holes 22c of the support leg main body 22. Moreover, the flange portion 25b needs to be thinner than the depth of the inner peripheral counter bore portion 22b of the support leg main body 22.

When the support leg main body 22 and the stand base 25 thus constructed are assembled, firstly as shown in FIG. 8, the flange portion 25b of the bearing base portion 25a is positioned so as to be faced on the inner peripheral counter bore portion 22b of the support leg main body 22. Then, the screw 23 is inserted through through-hole 25d of the stand base 25 and threaded into the screw-hole 22c of the support leg main body 22, and the other screws 23 are similarly threaded into the remaining screw-holes 22c aligned with the respective through-holes 25d of the stand base 25. When fastening of all the screws 23 has been completed, the brims 23a formed on the screws 23 are brought into the state of being extended over the inner peripheral counter bore portion 22b, and the flange portion 25b is thus brought into the state of being latched in the inner peripheral counter bore portion 22b, therefore, the stand base 25 is made up into one piece with the support leg main body 22 with a play.

Therefore, when the equipment is completed in setting, the support leg device completed in assembling according to the third embodiment of the present invention comes into the state in which the bearing base portion 25a of the stand base 25 bears the spike body 24a of the bolt 24 as shown in FIG. 8. Moreover, when the equipment main body is pushed up, the stand base 25 is lowered to the position indicated by a dashed line in the same figure, and although the spire head of the spike body 24a and the bearing base portion 25a are spaced apart in-between, the screws 23 prevent the stand base 25 from falling, and one-piece state of the support leg main body 22 and the stand base 25 can be maintained.

Figure 10:
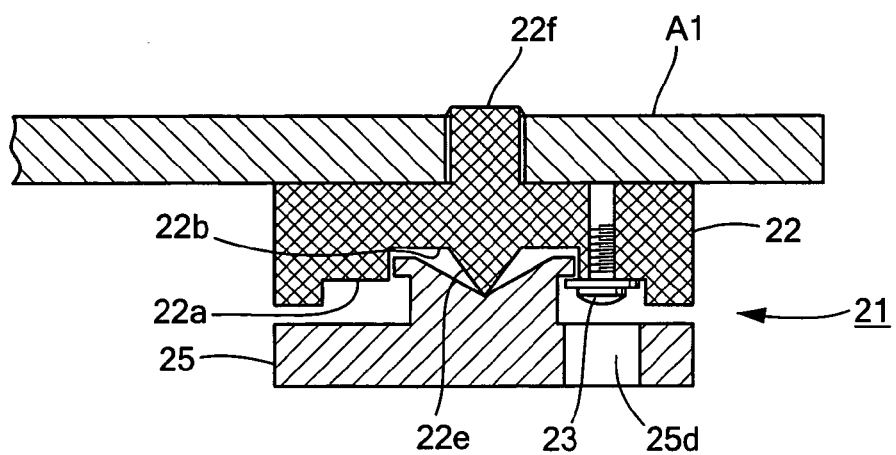
FIG. 10 is a sectional view of the fourth embodiment of the support leg device according to the present invention.

FIG. 10 shows the fourth embodiment of the present invention, in which a spike body 22e and a screw portion 22f are made up into a support leg main body in one piece, and a support leg main body 22 is fastened to a bottom plate A1 of the equipment case by screwing the screw portion 22f into the screw-hole formed therein, so that the same function as in the third embodiment can be obtained.

Embodiment 5

Figure 11:
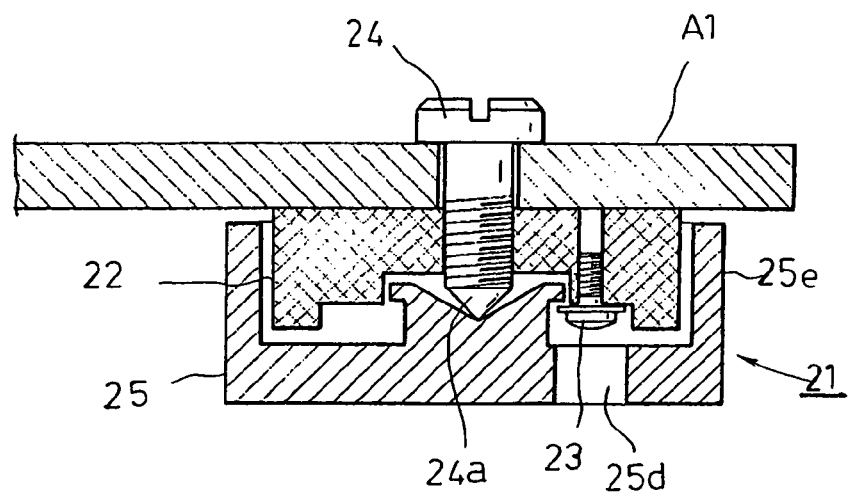
FIG. 11 is a sectional view of the fifth embodiment of the support leg device according to the present invention.

FIG. 11 shows the fifth embodiment of the present invention, in which a stand base 25 and a peripheral wall 25e rising from the periphery of the stand base and surrounding a support leg main body 22 are formed in one piece, and thereby the support leg device can be provided with the same function as in the third embodiment, and is also provided with an effect of design as if the support leg device is made up of a single portion. Moreover, the construction of the fifth embodiment can be embodied also in the fourth embodiment or the sixth embodiment which will be described in the following.

Embodiment 6

Figure 12:
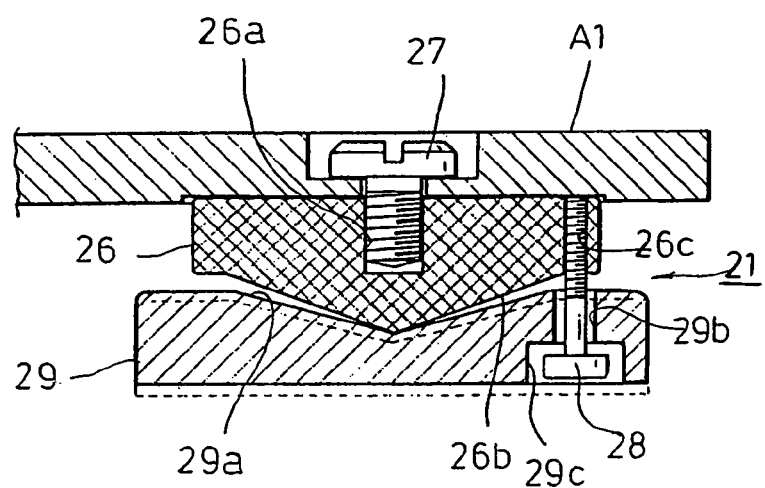
FIG. 12 is a sectional view of the sixth embodiment of the support leg device according to the present invention.
Figure 13:
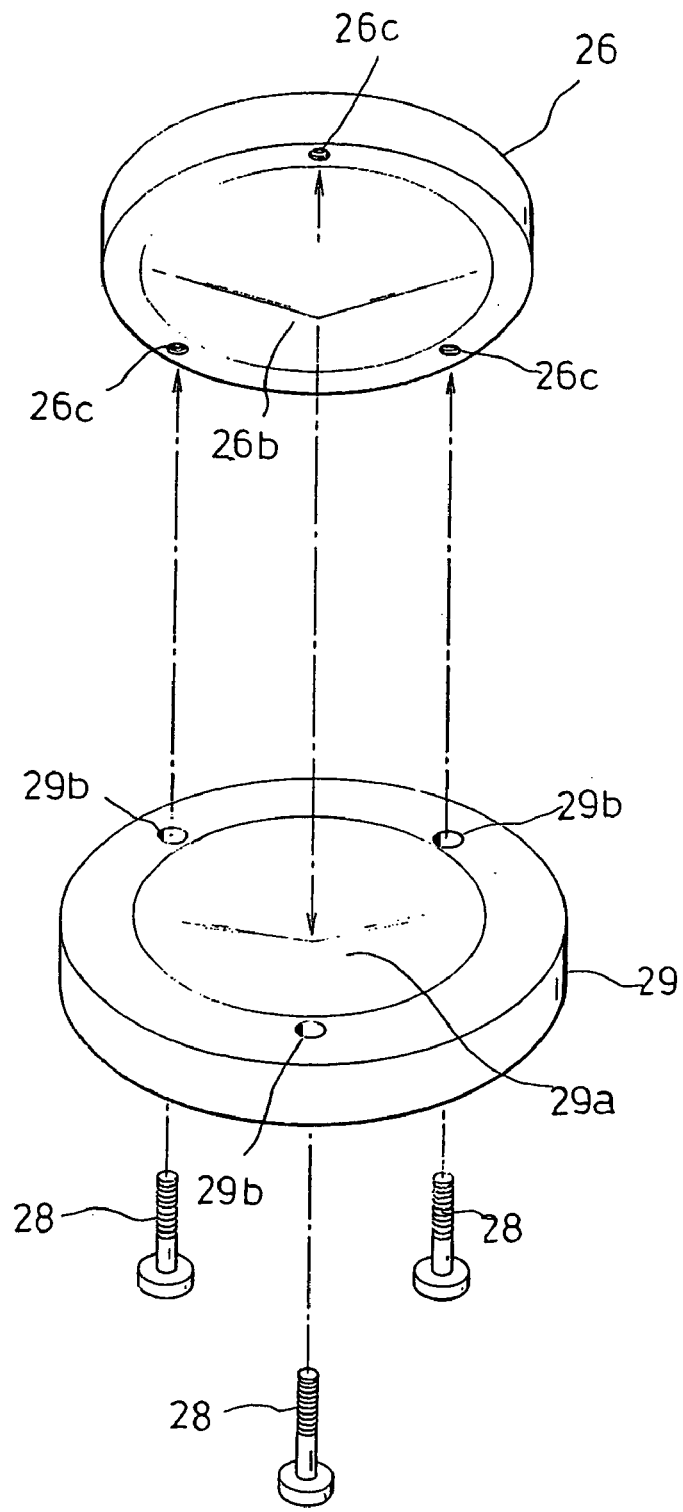
FIG. 13 is an exploded perspective view of the sixth embodiment of the support leg device according to the present invention.
Figure 14:
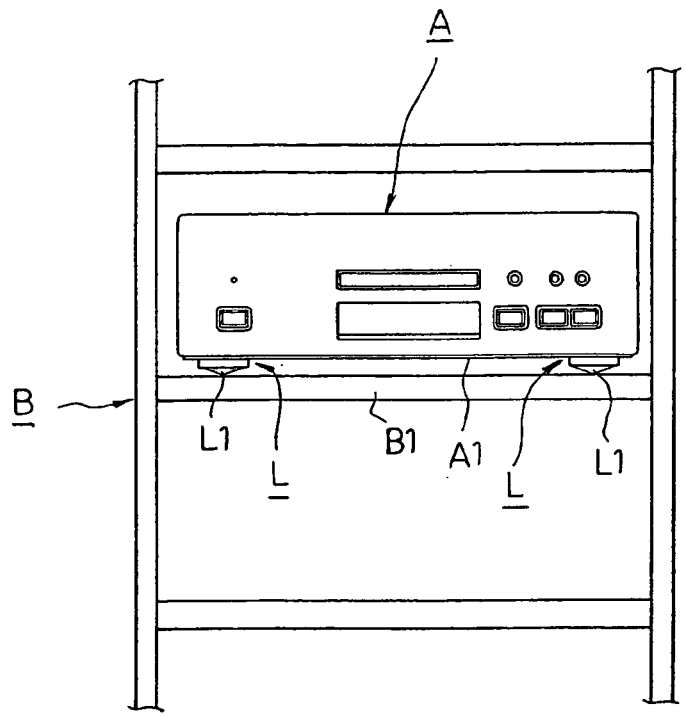
FIG. 14 is a front view showing a state of an arrangement of an audio equipment.
Figure 15:
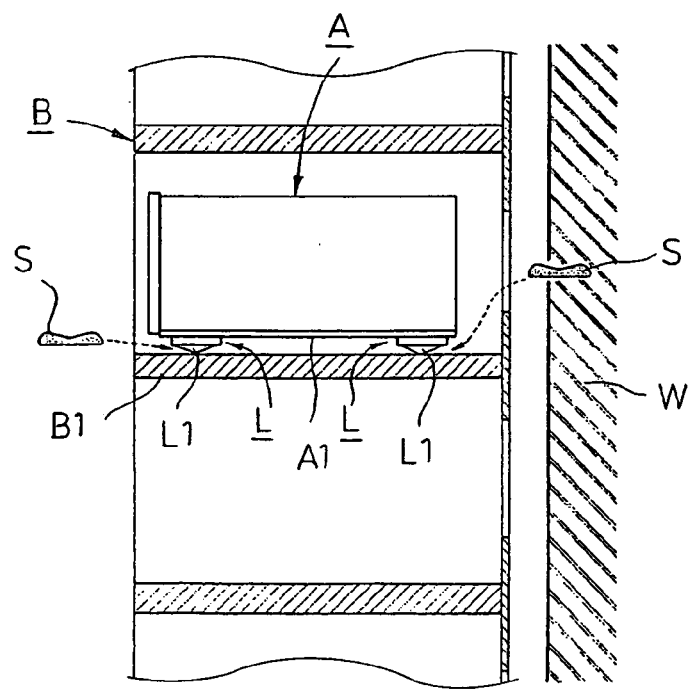
FIG. 15 is a drawing for explaining setting of an audio equipment.
Figure 16:
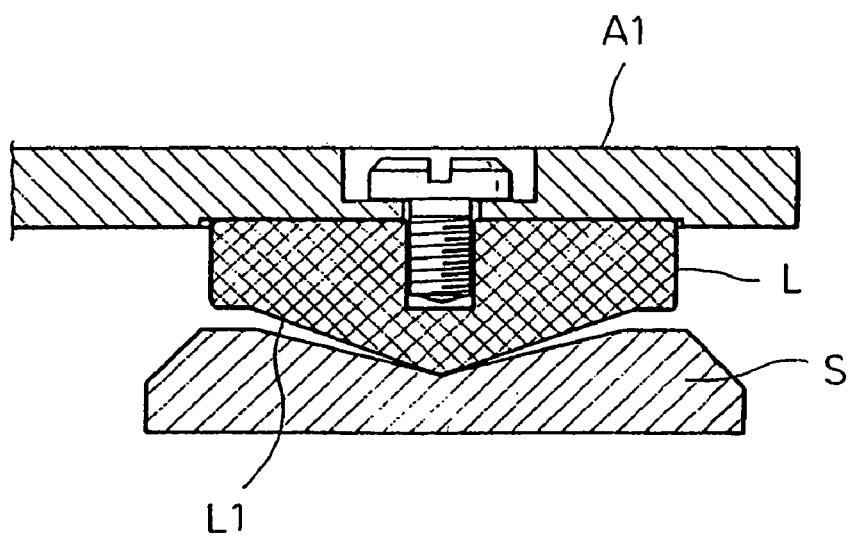
FIG. 16 is a sectional view showing an example of a conventional support leg device.

FIG. 12 and FIG. 13 show the sixth embodiment of the present invention, in which a support leg main body itself is projectingly formed like a spike body, and thereby the support leg main body and a stand base can be simplified in the outward form. Namely, a support leg main body 26 in the sixth embodiment is formed with a tapped hole 26a at the center of the upper surface, and the bottom face is formed with a conic spike body 26b. And, the support leg main body 26 is fastened together with a bottom plate A1 of the case by screwing a bolt 27 into the tapped hole 26a from the inside of the equipment case. Moreover, the periphery of the support leg main body 26 is formed with three screw-holes 26c at equal angle positions for threading the screws 28 into them.

On the other hand, the upper surface of a stand base 29 is formed with a tapered surface 29a declining from the periphery toward the center. Further, through-holes 29b are formed at the positions in the periphery of the stand base 29 and opposite to the screw-holes 26c of the support leg main body 26, and these through-holes 29b communicate with counter bore portions 29c on the bottom of the stand base 29.

When assembling the support leg main body 26 and the stand base 29 thus formed, the center of the stand base 29 is arranged to be faced to the center of the support leg main body 26. Then, the three screws 28 pass through the through-holes 29b of the stand base 29 and are threaded into the screw-holes 26c. When all the screws 28 have been threaded in such a manner, the head portions of the screws 28 stay in the respective counter bore portions 29c as shown in FIG. 12, and the assembly is made up so that the counter bore portions 29c are latched by the head portions of the screws 28, therefore, the stand base 29 is prevented from falling, and the support leg main body 26 and the stand base 29 are made up into one piece with a play state.

Therefore, as shown in FIG. 12, the support leg device completed in assembling according to the sixth embodiment of the present invention is in the state in which the spike body 26b of the support leg main body 26 is borne by the stand base 29 at the center of the tapered surface 29a when the equipment is completed in setting. Moreover, when the equipment main body is pushed up, the stand base 29 is lowered to the position indicated by the dashed line in the same figure, and the spire head of the spike body 26b and the stand base 29 are spaced apart in-between, however, the screws 28 prevent the stand base 29 from falling, and the support leg main body 26 and the stand base 29 are kept in the one-piece state.

As described in details in the above, according to the present invention as claimed in claim 1, the spire head portion of the spike body is not exposed from the bottom face of the leg pillar of the support leg main body, therefore, the spike body does not scratch the rack at the time of setting, and a high degree of safety without danger of injuring fingers can be secured.

Moreover, according to the present invention as claimed in claim 2, the spike body is screwed in the leg pillar, therefore, a degree of coupling between the spike body and the leg pillar is increased, and vibration and resonance can be eliminated effectively together with the effect of the spike body. Moreover, according to the present invention as claimed in claim 3, the spike body and the leg pillar are made up into one piece, therefore, vibration and resonance can be eliminated more effectively. Further, according to the present invention as claimed in claim 4, the leg pillar is provided with a cushioning material pasted on the bottom face and the rack is not scratched by the leg pillar itself, therefore, it is unnecessary at all to take care about the rack at the time of setting the equipment. Furthermore, according to the present invention as claimed in claim 5, the spire portion of the spike body does not stick out of the bottom face of the support leg main body, therefore, the rack is not scratched by the spike body at the time of setting the equipment.

In addition, according to the present invention as claimed in claim 6, the support leg device is made up of the support leg main body provided with the spike body and the stand base in one piece with a play state, therefore, the equipment main body has only to be set up to permit one-point supporting of the case by the support leg devices. As a result, this eliminates the need for placing the stand bases as a post-setting job, and also facilitates setting up work the equipment case into an installation space with poor dead space, and further, as the stand base is made up in one piece, the workability is very high also in a case of relocating the equipment main body.

Moreover, according to the present invention as claimed in claim 7, the stand base is formed with the peripheral wall so that it surrounds the support leg main body, therefore, the support leg device can be provided with an outward appearance as a single part, and can be improved in an effect of design.

What is claimed is:

1. A support leg, comprising:
   a body having a bottom surface that defines a recess;
   a downward-facing spike in the recess and attached to the body, the spike having a tip, wherein the spike does not extend beyond the bottom surface of the body; and
   a base below the body and in contact with the tip of the spike, wherein the base supports the body through the spike without contacting the bottom surface of the body.

2. The support leg of claim 1, wherein the body includes a threaded portion for attaching the support leg to a device.

3. The support leg of claim 1, wherein the spike is a bolt threaded through the body.

4. The support leg of claim 1, further comprising cushioning material having a top surface and a bottom surface, the top surface of the cushioning material being attached to at least a portion of the bottom surface of the body; and wherein the base supports the body through the spike without contacting the bottom surface of the cushioning material.

5. The support leg of claim 1, wherein the base is loosely attached to the body.

6. The support leg of claim 1, wherein the base is loosely attached to the body by at least one fixing member.

7. The support leg of claim 6, wherein the least one fixing member is a screw.

8. The support leg of claim 7, wherein the at least one fixing member is threaded into the bottom surface of the body.

9. The support leg of claim 8, wherein the base defines at least one hole aligned with the at least one fixing member.

10. The support leg of claim 1, wherein the base includes a peripheral wall surrounding the body.

11. A support leg, comprising:
    a body having a bottom surface that defines a recess;
    a downward-facing spike in the recess and attached to the body, the spike having a tip;

cushioning material having a top surface and a bottom surface, the top surface of the cushioning material being attached to at least a portion of the bottom surface of the body, wherein the spike does not extend beyond the bottom surface of the cushioning material; and a base below the body and in contact with the tip of the spike, wherein the base supports the body through the spike without contacting the bottom surface of the cushioning material.

12. The support leg of claim 11, wherein the body includes a threaded portion for attaching the support leg to a device.

13. The support leg of claim 11, wherein the spike is a bolt threaded through the body.

14. The support leg of claim 11, wherein the base is loosely attached to the body.

15. The support leg of claim 11, wherein the base is loosely attached to the body by at least one fixing member.

16. The support leg of claim 15, wherein the least one fixing member is a screw.

17. The support leg of claim 16, wherein the at least one fixing member is threaded into the bottom surface of the body.

18. The support leg of claim 17, wherein the base defines at least one hole aligned with the at least one fixing member.

19. A support leg, comprising:

a body having a bottom surface that defines a downward-facing spike, the spike having a tip; and a base below the body and loosely attached to the body by at least one discrete fixing member, the base being in contact with the tip of the spike, wherein the base supports the body at only the tip of the spike without contacting other portions of the bottom surface of the body.

20. A support leg comprising:

a body having a bottom surface that defines a downward-facing spike, the spike having a tip; and a base below the body and loosely attached to the body by at least one discrete fixing member, the base being in contact with the tip of the spike, wherein the base supports the body at only the tip of the spike without contacting other portions of the bottom surface of the body, wherein the at least one fixing member is a screw.

21. The support leg of claim 20, wherein the at least one fixing member is threaded into the bottom surface of the body.

22. The support leg of claim 21, wherein the base defines at least one hole aligned with the at least one fixing member.

23. The support leg of claim 19, wherein the body includes a threaded portion for attaching the support leg to a device.

24. The support leg of claim 19, wherein the body is made of a solid material.

* * * * *